(12) United States Patent
Lai

(10) Patent No.: US 7,132,848 B2
(45) Date of Patent: Nov. 7, 2006

(54) POWER MANAGEMENT CIRCUIT

(75) Inventor: Fang-Shi Lai, Chia Yi (TW)

(73) Assignee: Taiwan Semiconductor Manufacturing Co, Ltd., Hsinchu (TW)

( * ) Notice: Subject to any disclaimer, the term of this patent is extended or adjusted under 35 U.S.C. 154(b) by 49 days.

(21) Appl. No.: 10/898,750

(22) Filed: Jul. 26, 2004

(65) Prior Publication Data

US 2006/0017469 A1    Jan. 26, 2006

(51) Int. Cl.
  *H03K 19/003* (2006.01)
(52) U.S. Cl. .................. 326/33; 326/126; 326/127
(58) Field of Classification Search .................. 326/33, 326/95–8, 112, 119, 121, 126–127
  See application file for complete search history.

(56) References Cited

U.S. PATENT DOCUMENTS

| | | | |
|---|---|---|---|
| 5,615,162 A | 3/1997 | Houston | 365/226 |
| 6,287,920 B1 | 9/2001 | Chatterjee et al. | 438/276 |
| 6,657,887 B1 | 12/2003 | Higeta et al. | 365/156 |
| 6,664,608 B1 | 12/2003 | Burr | 257/549 |
| 6,667,648 B1 | 12/2003 | Stout et al. | 327/333 |
| 6,707,702 B1 | 3/2004 | Komatsuzaki | 365/145 |
| 2004/0196082 A1* | 10/2004 | Pacha et al. | 327/215 |

OTHER PUBLICATIONS

"Design and Implementation of Differential Cascode Voltage Switch with Pass-Gate (DCVSPG) Logic for High-Performance Digital Systems" Lai et al.; 1997, no date.
USPTO Office Action mailed Dec. 14, 2005 for U.S. Appl. No. 10/899,320, filed Jul. 26, 2004.

* cited by examiner

*Primary Examiner*—Anh Q. Tran
(74) *Attorney, Agent, or Firm*—Thomas, Kayden, Horstemeyer & Risley (57) ABSTRACT

A power management circuit. A logic cell switched between normal and standby modes according to a power control signal includes a plurality of first NMOS transistors coupled between at least one complementary pair of data signal inputs and a complementary pair of data signal outputs, a first PMOS transistor and a second PMOS transistor. A first switch is coupled between a power voltage, the power control signal and the logic cell. A latch circuit coupled between the power voltage and the data signal outputs preserves the voltage levels respectively of the complementary pair of data signal outputs when the logic cell operates in the standby mode.

16 Claims, 7 Drawing Sheets

POWER MANAGEMENT CIRCUIT

BACKGROUND OF THE INVENTION

1. Technical Field

The present disclosure relates in general to a circuit for power management of standard cell application. In particular, the present disclosure relates to a circuit for power management of differential cascode voltage switch (DCVS) logic cells and differential cascode voltage switch with pass-gate (DCVSPG).

2. Description of the Related Art

Differential cascode voltage switch (DCVS) logic is a dual-rail CMOS circuit technique with advantages over single-rail traditional logic circuit techniques in terms of circuit delay, layout area and logic flexibility. A further advantage to DCVS circuits is the fact that they can be readily designed for a complex Boolean logic function within single gate delay using straightforward procedures based on Karnaugh maps and tabular methods. The logic function may also be synthesized.

Figure 1A:
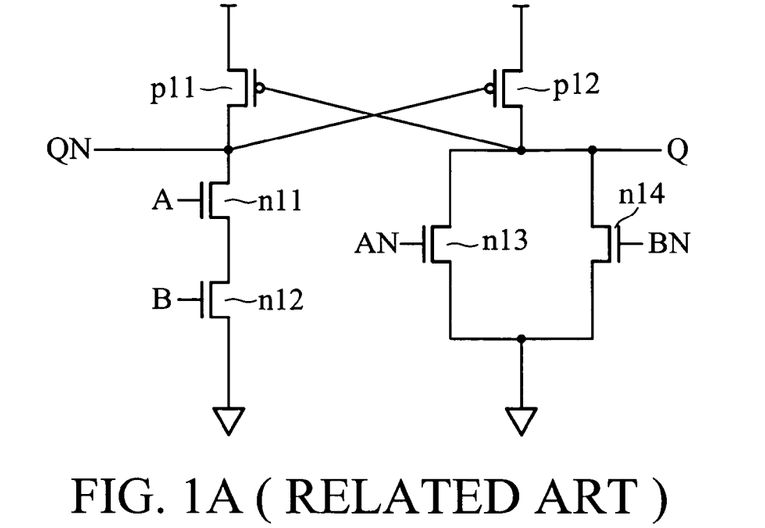
FIG. 1A and FIG. 1B are conventional circuits of DCVS AND logic cell and DCVSPG AND logic cell, respectively.
Figure 1B:
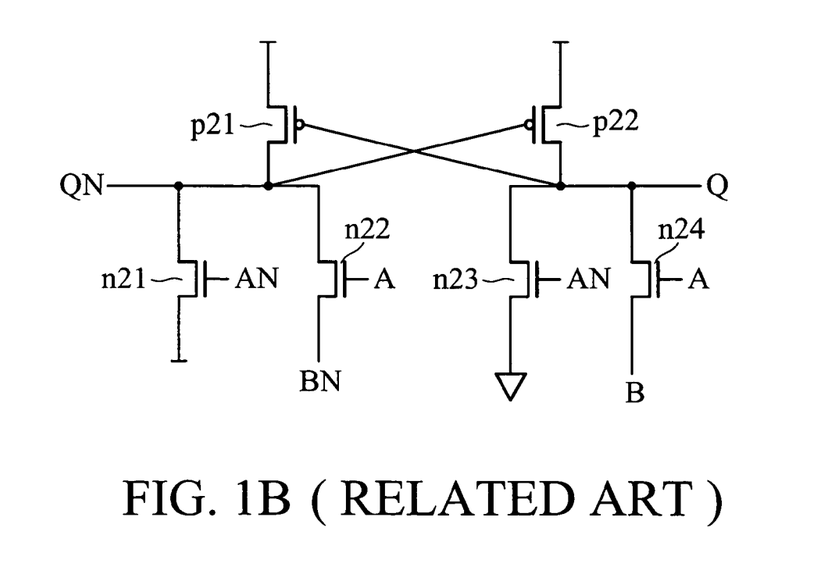

An application entitled "Design and implementation of differential cascode voltage switch with pass-gate (DCVSPG) logic for high-performance digital systems" is disclosed on IEEE JOURNAL OF SOLID-STATE CIRCUITS, VOL. 32, NO. 4, APRIL 1997. FIG. 1A and FIG. 1B are conventional circuits of DCVS AND logic cell and DCVSPG AND logic cell, respectively.

In FIG. 1A, the DCVS circuit comprises two cross-coupled PMOS transistors p11 and p12 forming the circuit load. Below the PMOS load, four NMOS transistors n11, n12, n13, and n14 form the n-channel logic evaluation tree. Transistors n11 and n12 are turned on when the input signals A and B swing from low to high. The node QN is then discharged to the ground. The node Q floats at the transition period when the complementary input signals AN and BN swing from high to low. Both of the NMOS transistors n13 and n14 are turned off. The cross-coupled PMOS transistor p12 is turned on by the ground level at the node QN. The output node will be charged to high. Thus, the AND logic function is realized.

The DCVSPG AND circuit shown in FIG. 1B also comprises two cross-coupled PMOS transistors p21 and p22 forming the circuit load. The cross-coupled PMOS device load is the same as in FIG. 1A. With the same previous state, when both input signals A and B swing from low to high, the NMOS transistors n22 and n24 are both turned on. The node QN is then discharged into ground when the complementary signals AN and BN swing from high to low.

Figure 2:
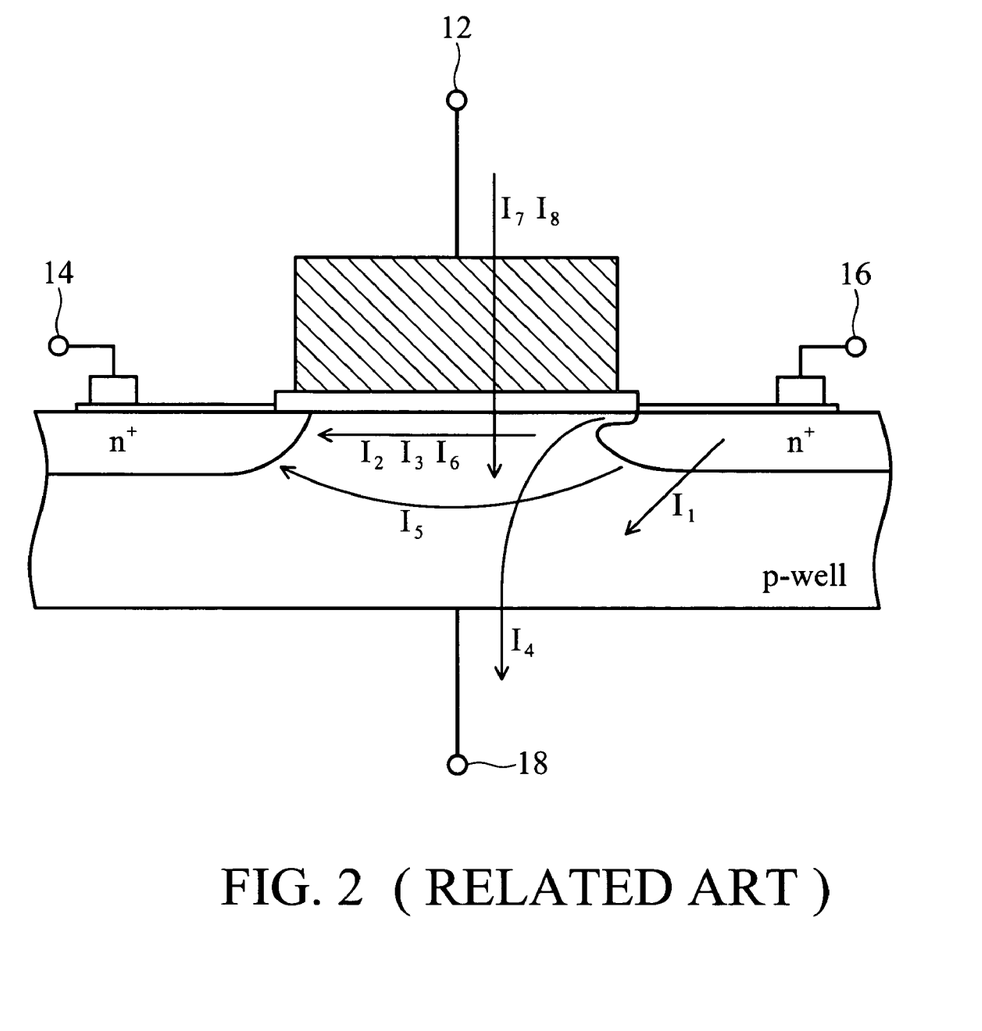
FIG. 2 shows current leakage sources in a transistor.

However, the conventional circuits described suffer standby leakage problems when the circuits are in standby mode. Standby leakage problems are serious concerns in very deep submicron technology with device size reductions, causing output state of DCVS or DCVSPG logic cells changed. FIG. 2 shows current leakage sources in a transistor 10. The transistor 10 comprises a gate 12, a source 14, a drain 16 and a well 18. Current leakage is caused by junction leakage $I_1$, weak inversion $I_2$, drain induced barrier lowering $I_3$, gate induced drain leakage $I_4$, punchthrough $I_5$, narrow width effect $I_6$, gate oxide tunneling $I_7$ and hot carrier injection $I_8$. Thus, data stored in a logic cell of a chip can be lost in standby mode because of standby leakage.

Solutions to the standby leakage problem mentioned, especially subthreshold leakage and gate leakage, generally involve increased package costs and design difficulty in handling power distribution. In addition, excessive power consumption limits the usage of very deep submicron technology due to increased processing costs as well as extra costs to handle the unexpected power. Thus, power management has become a significant and challenging issue in recent chip design.

U.S. Pat. No. 6,287,920 to Chatterjee, et al. discloses a method for forming multiple threshold voltage integrated into circuit transistors. Angled pocket type implants are formed to create asymmetric regions. The source and drain regions are connected such that multiple threshold voltage transistors are formed. Several different threshold voltage libraries must be employed to implement the multiple threshold voltage method. In addition, power saving is typically limited and often insufficient. The multiple threshold voltage method requires extra masks for different threshold voltage and power.

U.S. Pat. No. 6,664,608 to Burr, et al. discloses a back-biased MOS device. A plurality of p-wells and n-wells are formed on a front side of a bulk material, and a plurality of n layers and p layers are alternately formed within the bulk material between a back side thereof and the plurality of n-wells and p-wells. The plurality of n layers are electrically isolated from one another and respectively route different potentials to selected n-wells, and likewise, the plurality of p layers are electrically isolated from one another and respectively route different potentials to selected p-wells. However, disadvantages of the back-biased method include the need for additional charge pump or multiple power supplies to apply extra bias to the well and/or substrate, junction or gate oxide breakdown concerns, excessive time required to charge or discharge between different modes, deep N-well process required, wasted power and design difficulty.

U.S. Pat. No. 6,667,648 to Stout, et al. discloses a voltage island communications circuit. An integrated circuit comprises a first circuit powered by a first power supply. The first circuit sends a first signal referenced to the voltage of the first power supply to a second circuit powered by a second power supply. The second circuit receives the first signal and converts the first signal to a second signal of the same logical value as the first signal and is referenced to the voltage of the second power supply. However, complicated design and tools are required by the voltage island method. In addition, the voltage island method cannot solve leakage problems in most active circuit blocks.

The conventional methods described comprise use multiple Vt libraries, back-biased and voltage island methods to solve power consumption problems during standby mode. However, these cannot solve the gate leakage problem without changing the normal power supply voltage, creating design problems and delays in the systems resuming normal operation.

SUMMARY

One object, among others, of the present invention is thus to provide a circuit for power management of DCVS or DCVSPG logic cells using switches to disconnect the logic cells from supplied voltage, and latches to preserve the output state of the logic cells.

To achieve the above-mentioned object, some embodiments of the present invention provide a power management circuit. A logic cell switched between normal and standby modes according to a power control signal includes a plurality of first NMOS transistors coupled between at least one complementary pair of data signal inputs and a complementary pair of data signal outputs, a first PMOS transistor and a second PMOS transistor. A first switch is coupled between a power voltage, the power control signal and the logic cell. A latch circuit coupled between the power voltage and the data signal outputs preserves the voltage levels respectively of the complementary pair of data signal outputs when the logic cell operates in the standby mode.

BRIEF DESCRIPTION OF THE DRAWINGS

Various aspects of the present invention will become more fully understood from the detailed description, given hereinbelow, and the accompanying drawings. The drawings and description are provided for purposes of illustration only and, thus, are not intended to be limiting of the present invention.

DETAILED DESCRIPTION OF THE INVENTION

First Embodiment

Figure 3:
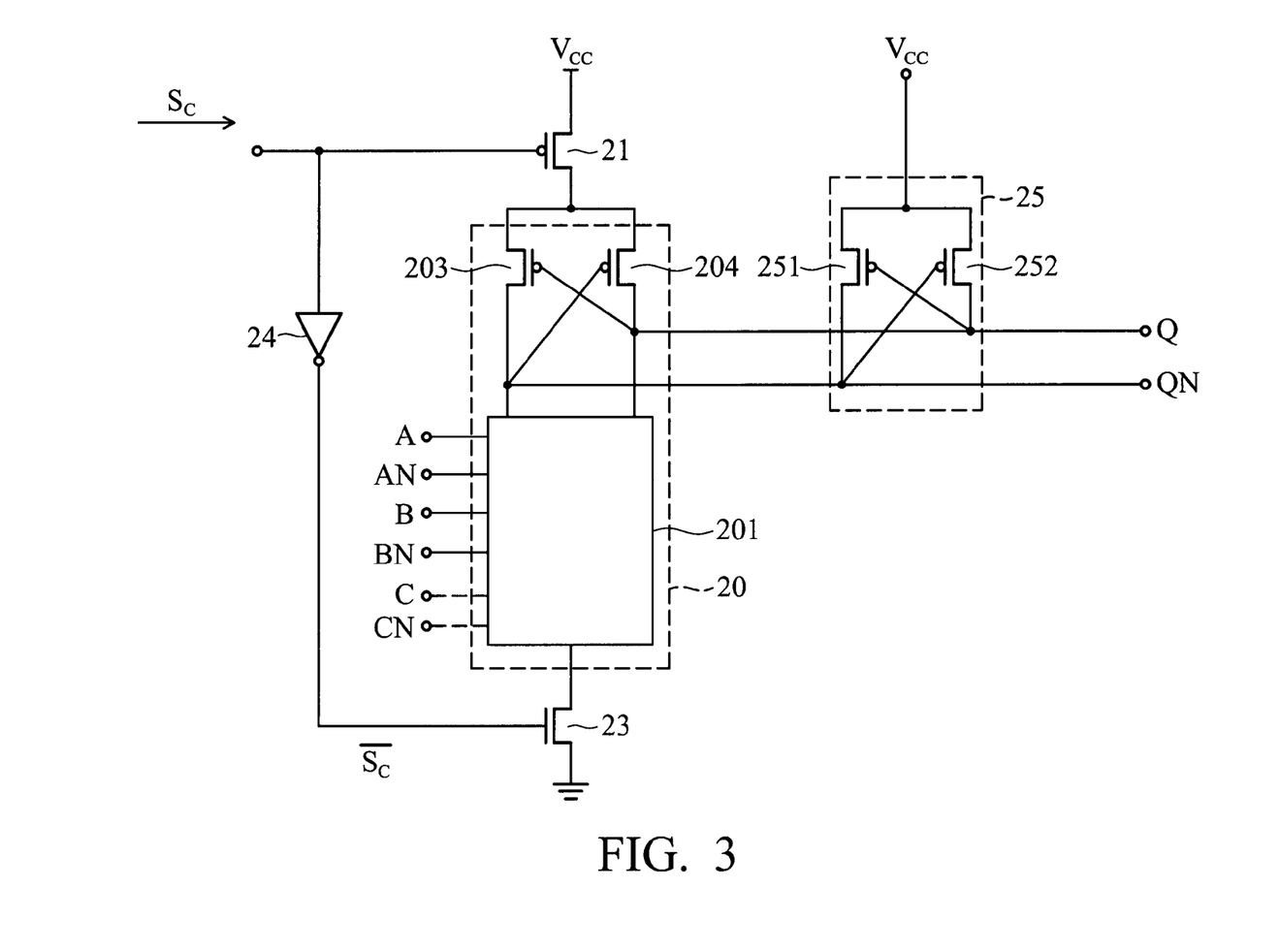
FIG. 3 is a circuit diagram of a power management circuit according to the first embodiment of the present invention.

FIG. 3 is a circuit diagram of a power management circuit according to the first embodiment of the present invention. The power management circuit according to the first embodiment of the present invention switches logic cell 20 between normal and standby modes according to a power control signal Sc. The logic cell 20 in the present invention can be a DCVS circuit or a DCVSPG circuit.

Figure 4:
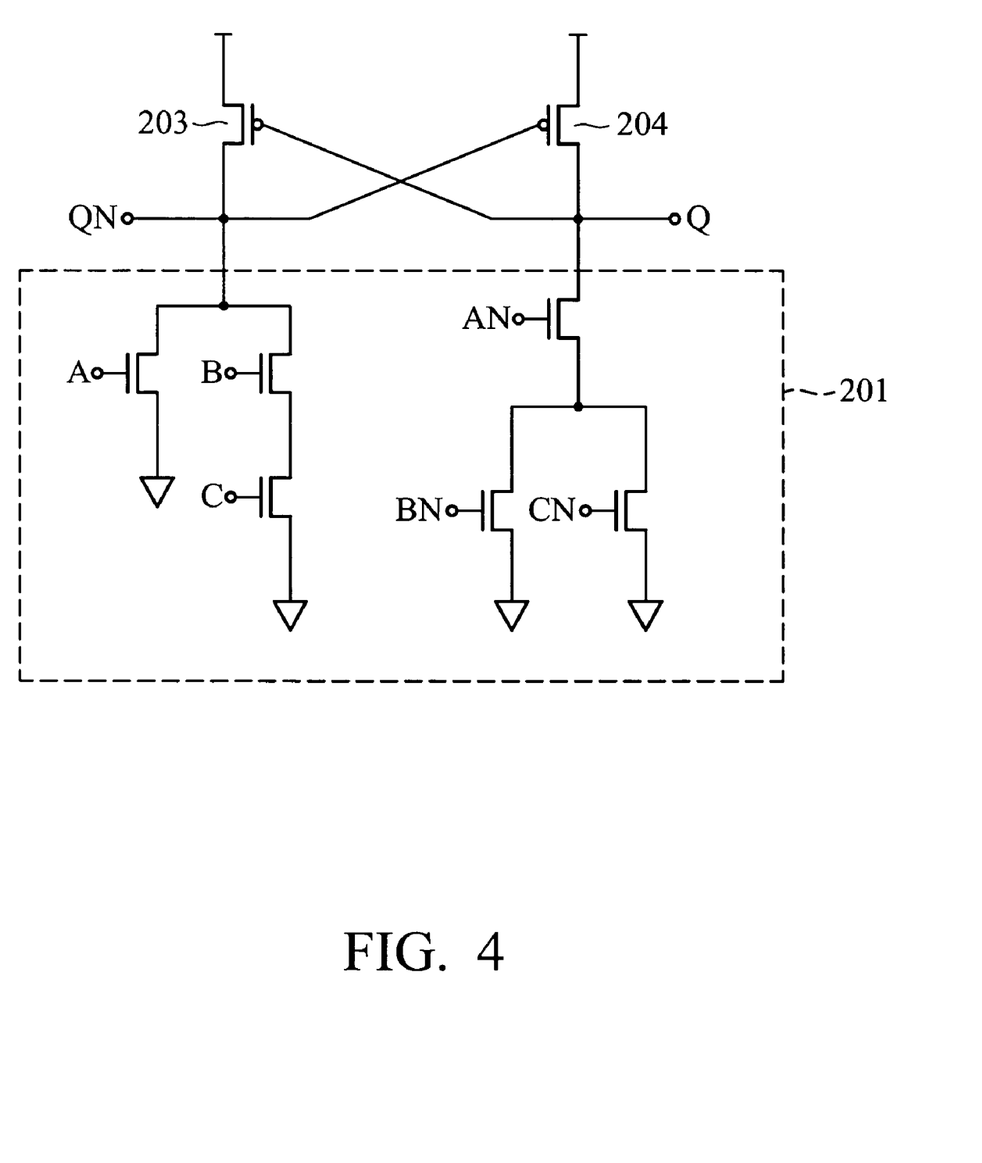
FIG. 4 shows a differential cascode voltage switch (DCVS) circuit.

FIG. 4 shows a differential cascode voltage switch (DCVS) circuit. The gates of PMOS transistors 203 and 204 are respectively coupled to a complementary pair of data signal outputs Q and QN. The sources of PMOS transistors 203 and 204 are coupled to power source $V_{cc}$. The drains of PMOS transistors 204 and 203 are respectively coupled to a complementary pair of data signal outputs Q and QN. It is noted that the DCVS circuit comprises two PMOS transistors 203 and 204, and a plurality of NMOS transistors in block 201.

Figure 5A:
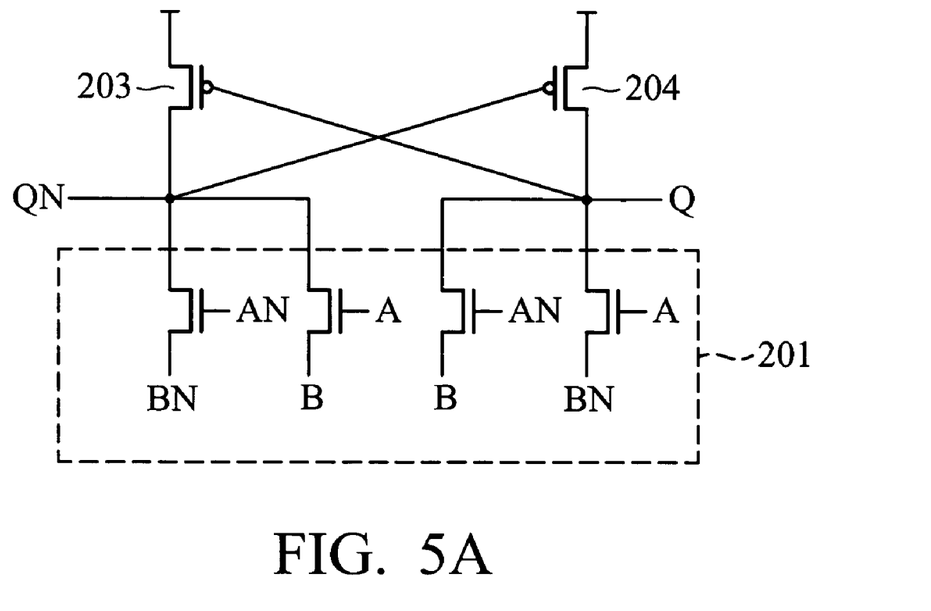
FIGS. 5A~5C show a two-way differential cascode voltage switch with pass-gate (DCVSPG) circuit.
Figure 5B:
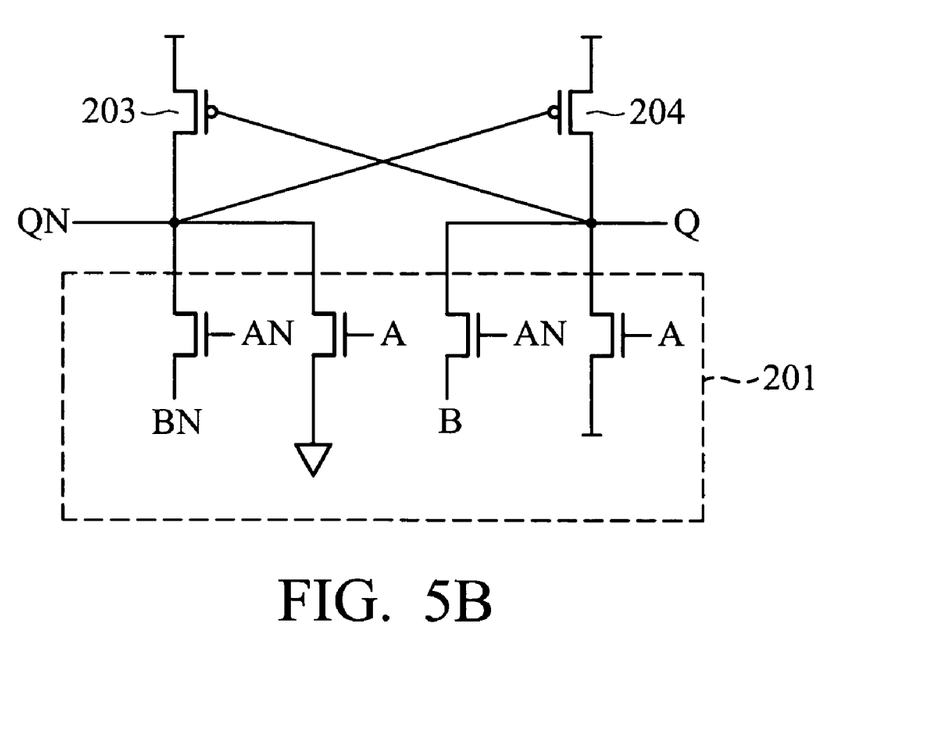
Figure 5C:
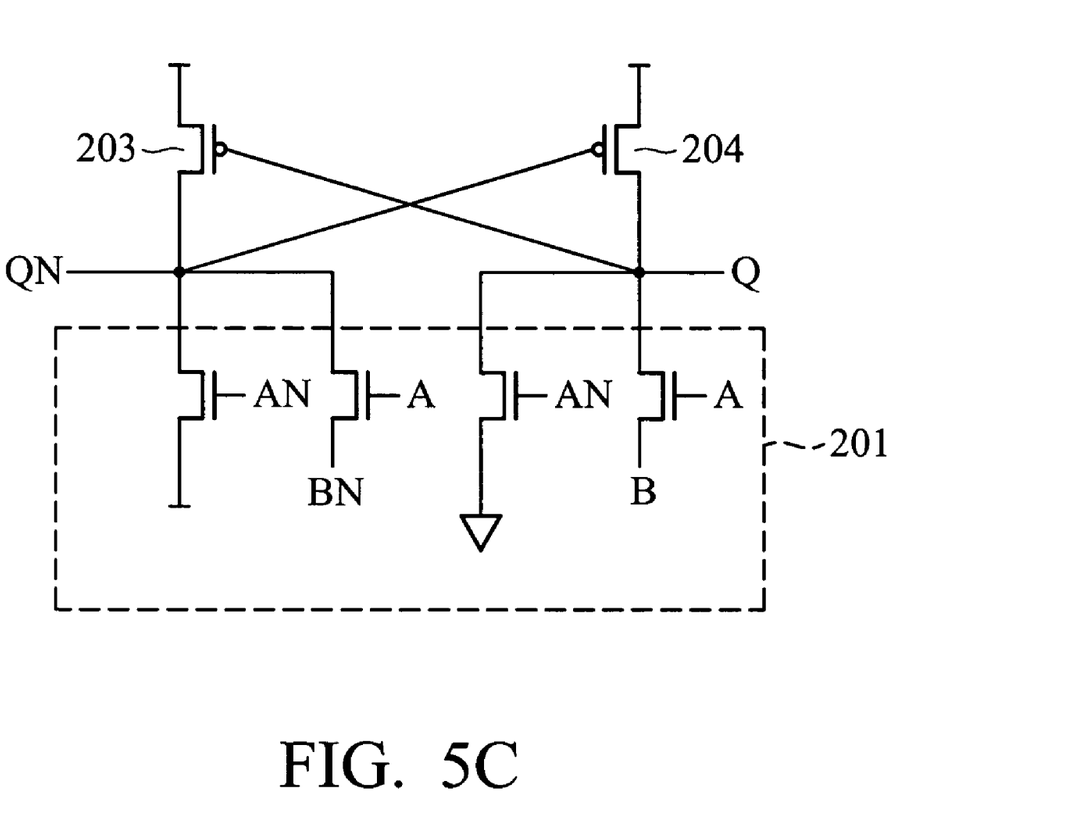

FIGS. 5A~5C show a two-way differential cascode voltage switch with pass-gate (DCVSPG) circuit, an AND/NAND logic gate, an OR/NOR logic gate, and a XOR/XNOR logic gate, in sequence. In FIGS. 5A~5C, the connections between PMOS transistors 203 and 204 are similar to those in FIG. 4. In addition, the transistors in block 201 are all NMOS transistors.

Logic cell 20 comprises complementary pairs of data signal inputs (A, AN), (B, BN) and/or (C, CN), and a complementary pair of data signal outputs Q and QN. Here, each transistor in logic cell 20 has a gate oxide layer and a threshold voltage.

PMOS transistor 21 (head switch) is coupled between a power voltage Vcc and the connection point of the sources of PMOS transistors 203 and 204. The gate of the PMOS transistor 21 receives the power control signal Sc. NMOS transistor 23 (foot switch) is coupled between a ground voltage and logic cell 20. PMOS transistor 21 is turned off to disconnect a current path between logic cell 20 and the ground voltage. Inverter 24 is connected between the gate of PMOS transistor 21 and that of NMOS transistor 23, which inverts the power control signal Sc to a reverse power control signal $\overline{Sc}$. The reverse power control signal $\overline{Sc}$ is applied to the gate of the NMOS transistor 23. Thus, PMOS transistor 21 and NMOS transistor 23 are turned off to disconnect the current path between power voltage Vcc and the ground voltage when the power control signal Sc is at a low voltage level. Thus, the logic cell 20 operates in the standby mode.

Folding latch circuit 25 is coupled between the power voltage $V_{cc}$ and the complementary pair of data signal outputs Q and QN to preserve the voltage level thereof, comprising PMOS transistors 251 and 252.

PMOS transistor 251 comprises a source coupled to power voltage Vcc, a drain coupled to the gate of PMOS transistor 252 and data signal output QN, and a gate coupled to the data signal output Q. PMOS transistor 252 comprises a source coupled to power voltage Vcc, a drain coupled to the gate of PMOS transistor 251 and data signal output Q, and a gate coupled to the data signal output QN.

The threshold voltages of NMOS transistor 23, and PMOS transistors 21, 251 and 252 are higher than those in the logic cell 20, such as PMOS transistors 203 and 204 and the NMOS transistors in block 201. Alternately, the oxide layers of NMOS transistors 23, and PMOS transistors 21, 251 and 252 are thicker than those of the logic cell 20.

When power control signal Sc is at low voltage level, PMOS transistors 21 and NMOS transistors 23 are turned on and PMOS transistors 251 and 252 act as an extra load. Thus, logic cell 20 outputs data with a predetermined logic level from the complementary pair of data signal outputs Q and QN according to input signals respectively applied to the complementary pair of data signal inputs (A, AN), (B, BN) and/or (C, CN) When power control signal Sc switches to high voltage level, PMOS transistor 21 and NMOS transistor 23 are turned off. Thus, logic cell 20 operates in standby mode. In addition, a predetermined logic level (high logic level as an example) of data signal outputs Q is applied to the gate of PMOS transistor 251, and an inverted logic level (low logic level as an example) of data signal outputs QN is applied to the gate of PMOS transistor 252. Thus, PMOS transistor 252 is turned on to maintain the high logic level of data signal output Q. Thus, output state of logic cell 20 is preserved by latch circuit 25.

It is noted that the current leakage in NMOS transistor 23 must be less than or equal to that in latch circuit 25 to maintain the logic level of data signal outputs Q and QN.

In addition, the NMOS transistor 23 (foot switch) in the first embodiment may be eliminated to make design easier. However, current leakage of the logic cell 20 will be more serious than that with the foot switch, but still less than the conventional circuit without the head switch.

As transistors 21 and 23, and the transistors 251 and 252 of latch circuit 25 are fabricated with high threshold voltage and thicker gate oxide process, subthreshold leakage current and gate leakage current thereof are respectively reduced by the high threshold voltage and the thicker gate oxide layer during standby mode.

Second Embodiment

Figure 6:
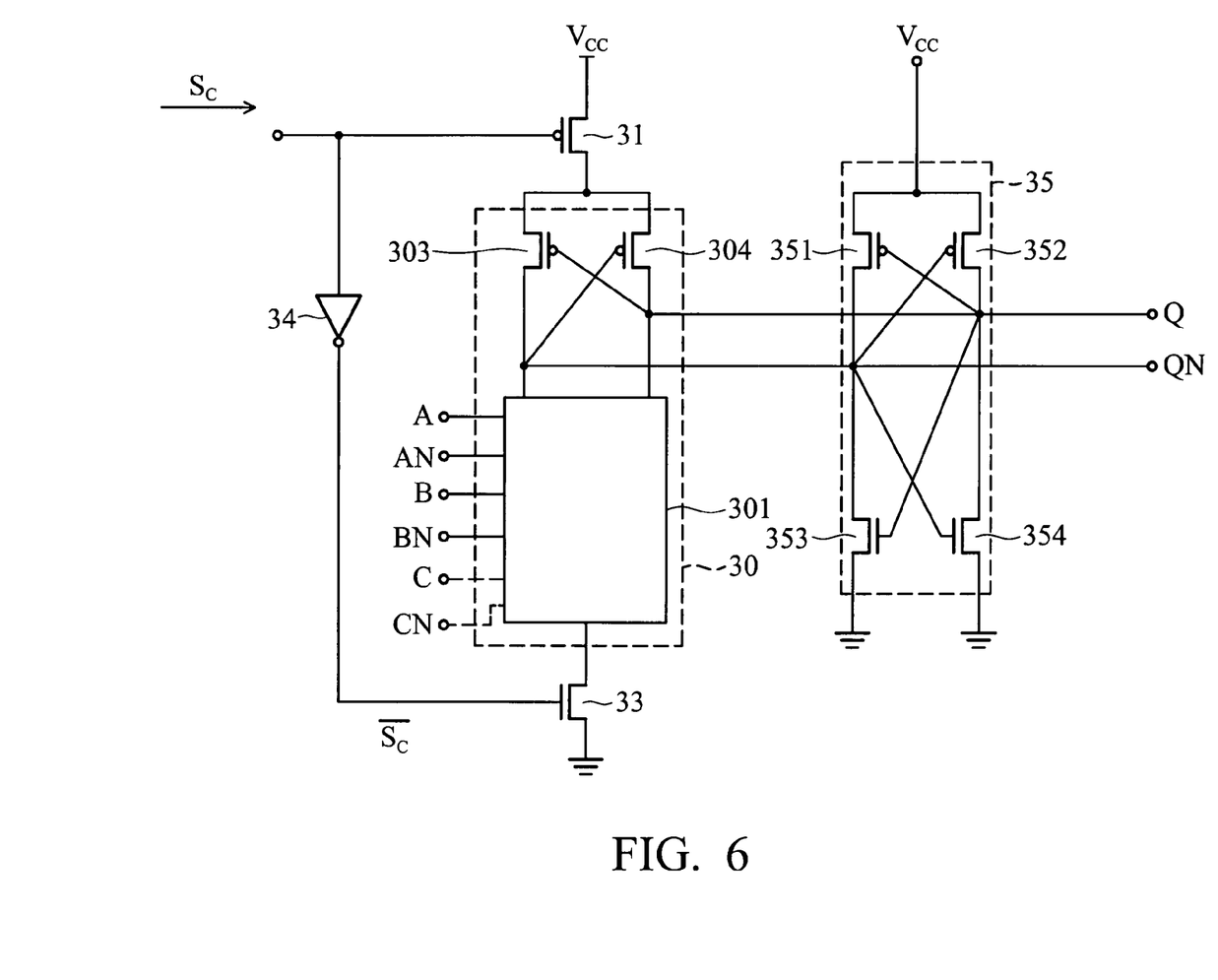
FIG. 6 is a circuit diagram of a power management circuit according to the second embodiment of the present invention.

FIG. 6 is a circuit diagram of a power management circuit according to the second embodiment of the present invention. The power management circuit according to the second embodiment of the present invention switches logic cell 30 between normal and standby modes according to a power control signal Sc. The logic cell 30 in the present invention can be a DCVS circuit or a DCVSPG circuit respectively shown in FIG. 4 and FIGS. 5A~5C.

Logic cell 30 comprises complementary pairs of data signal inputs (A, AN), (B, BN) and/or (C, CN), and a complementary pair of data signal outputs Q and QN. Here, each transistor in logic cell 30 has a gate oxide layer and a threshold voltage.

PMOS transistor 31 (head switch) is coupled between a power voltage Vcc and the connection point of the sources of PMOS transistors 303 and 304. The gate of the PMOS transistor 31 receives the power control signal Sc. NMOS transistor 33 (foot switch) is coupled between a ground voltage and logic cell 30. PMOS transistor 31 is turned off to disconnect a current path between logic cell 30 and the ground voltage. Inverter 34 is connected between the gate of PMOS transistor 31 and that of NMOS transistor 33, which inverts the power control signal Sc to a reverse power control signal $\overline{Sc}$. The reverse power control signal $\overline{Sc}$ is applied to the gate of the NMOS transistor 33. Thus, PMOS transistor 31 and NMOS transistor 33 are turned off to disconnect the current path between power voltage Vcc and the ground voltage when the power control signal Sc is at a low voltage level. Thus, the logic cell 30 operates in the standby mode.

Folding latch circuit 35 is coupled between the power voltage $V_{cc}$ and the complementary pair of data signal outputs Q and QN to preserve the voltage level thereof, comprising PMOS transistors 351 and 352, and NMOS transistor 353 and 354.

PMOS transistor 351 comprises a source coupled to power voltage Vcc, a drain coupled to the gate of PMOS transistor 352 and data signal output QN, and a gate coupled to the data signal output Q. PMOS transistor 352 comprises a source coupled to power voltage Vcc, a drain coupled to the gate of PMOS transistor 351 and data signal output Q, and a gate coupled to the data signal output QN.

NMOS transistor 353 comprises a source coupled to ground, a drain coupled to the gate of PMOS transistor 352 and data signal output QN, and a gate coupled to the data signal output Q and the gate of PMOS transistor 351. NMOS transistor 354 comprises a source coupled to ground, a drain coupled to the gate of PMOS transistor 351 and data signal output Q, and a gate coupled to the data signal output QN and the gate of PMOS transistor 352.

The threshold voltages of NMOS transistors 33, 353 and 354, and PMOS transistors 31, 351 and 352 are higher than those in the logic cell 30, such as PMOS transistors 303 and 304 and the NMOS transistors in block 301. Alternately, the oxide layers of NMOS transistors 33, 353 and 354, and PMOS transistors 31, 351 and 352 are thicker than those of the logic cell 30.

When power control signal Sc is at low voltage level, PMOS transistors 31 and NMOS transistors 33 are turned on and PMOS transistors 351 and 352 and NMOS transistors 353 and 354 act as an extra load. Thus, logic cell 30 outputs data with a predetermined logic level from the complementary pair of data signal outputs Q and QN according to input signals respectively applied to the complementary pair of data signal inputs (A, AN), (B, BN) and/or (C, CN). When power control signal Sc switches to high voltage level, PMOS transistor 31 and NMOS transistor 33 are turned off. Thus, logic cell 30 operates in standby mode. In addition, a predetermined logic level (high logic level as an example) of data signal outputs Q is applied to the gates of PMOS transistor 351 and NMOS transistor 353, and an inverted logic level (low logic level as an example) of data signal output QN is applied to the gates of PMOS transistor 352 and NMOS transistor 354. Thus, PMOS transistor 352 is turned on to maintain the high logic level of data signal output Q, and NMOS transistor 353 is turned on to maintain the low logic level of data signal output QN. Thus, output state of logic cell 30 is preserved by latch circuit 35.

As transistors 31 and 33, and the transistors 351~354 of latch circuit 35 are fabricated with high threshold voltage and thicker gate oxide process, subthreshold leakage current and gate leakage current thereof are respectively reduced by the high threshold voltage and the thicker gate oxide layer during standby mode.

Accordingly, the power management circuit of the present invention does not change normal operation of the logic cells in normal mode. In addition, the head switch is turned off to disconnect the logic cells from the power supply. Thus, the subthreshold leakage and gate leakage of the logic cells are prevented. In addition, the output state of the logic cell is preserved by the latch circuit, such that high state and low state are sustained. Moreover, the embodiments of the present invention are totally transparent to circuit designs, with no need to design analog charge pump or use complex power design tools to partition the complicate design circuits. In addition, the logic cell resumes normal operation without interruption when the circuit returns to normal operation. Thus, the advantages of the present invention are a simple extra circuit design, alleviated subthreshold and gate leakage, no creation of signal variation during normal circuit operation such as in the back-biased or voltage island methods, preserved normal operation circuit states, no vector dependence and transparent power saving for circuit design.

The foregoing description of the preferred embodiments have been presented for purposes of illustration and description. Obvious modifications or variations are possible in light of the above teaching. The embodiments were chosen and described to provide the best illustration of the principles of the invention and its practical application to thereby enable those skilled in the art to utilize the various embodiments and their various modifications, as are suited to the particular use contemplated. All such modifications and variations are within the scope of the present invention.

What is claimed is:

1. A power management circuit, comprising:
   a logic cell comprising:
      a plurality of first NMOS transistors coupled between at least one complementary pair of data signal inputs and a complementary pair of data signal outputs;
      a first PMOS transistor comprising a first gate, a first source, and a first drain coupled to one data signal output; and
      a second PMOS transistor comprising a second gate coupled to the first drain, a second source coupled to the first source, and a second drain coupled to the other data signal output, wherein the logic cell is switched between normal and standby modes according to a power control signal;
   a first switch coupled between a power voltage, the power control signal and the connection point of the first source and the second source, wherein the first switch is turned off to disconnect the power voltage and the logic cell when the power control signal is at a predetermined level, such that the logic cell operates in standby mode; and
   a latch circuit coupled between the power voltage and the data signal outputs to preserve the voltage levels respectively of the complementary pair of data signal outputs when the logic cell operates in the standby mode.

2. The power management circuit as claimed in claim 1, wherein the first switch is a third PMOS transistor having a third gate coupled to the power control signal.

3. The power management circuit as claimed in claim 2, wherein the predetermined level is a low logic level.

4. The power management circuit as claimed in claim 3, further comprising a second switch coupled between the logic cell and a ground voltage, wherein the second switch is turned off when the power control signal is at the predetermined level.

5. The power management circuit as claimed in claim 4, wherein the second switch is a second NMOS transistor having a fourth gate coupled to a reverse power control signal.

6. The power management circuit as claimed in claim 5, further comprising an inverter coupled between the third gate and the fourth gate.

7. The power management circuit as claimed in claim 5, wherein the latch circuit comprises:
 a fourth PMOS transistor comprising a fifth gate coupled to the first gate, a fifth source coupled to the power voltage, and a fifth drain coupled to the second gate; and
 a fifth PMOS transistor comprising a sixth gate coupled to the second gate, a sixth source coupled to the power voltage, and a sixth drain coupled to the first gate.

8. The power management circuit as claimed in claim 7, wherein the latch circuit further comprises:
 a third NMOS transistor comprising a seventh gate coupled to the first gate, a seventh source coupled to the ground voltage, and a seventh drain coupled to the second gate; and
 a fourth NMOS transistor comprising an eighth gate coupled to the second gate, an eighth source coupled to the ground voltage, and an eighth drain coupled to the first gate.

9. The power management circuit as claimed in claim 7, wherein each the first NMOS transistors, the first PMOS transistor and the second PMOS transistor comprises a first gate oxide layer and a first threshold voltage.

10. The power management circuit as claimed in claim 9, wherein each of the second NMOS transistor, the third PMOS transistor, the fourth PMOS transistor, and the fifth PMOS transistor comprises a second oxide layer thicker than the first gate oxide layer.

11. The power management circuit as claimed in claim 9, wherein each of the second NMOS transistor, the third PMOS transistor, the fourth PMOS transistor, and the fifth PMOS transistor comprises a second threshold voltage higher than the first threshold voltage.

12. The power management circuit as claimed in claim 8, wherein each of the first NMOS transistors, the first PMOS transistor and the second PMOS transistor comprises a first gate oxide layer and a first threshold voltage.

13. The power management circuit as claimed in claim 12, wherein each of the second NMOS transistor, the third NMOS transistor, the fourth NMOS transistor, the third PMOS transistor, the fourth PMOS transistor, and the fifth PMOS transistor comprises a second oxide layer thicker than the first gate oxide layer.

14. The power management circuit as claimed in claim 12, wherein each of the second NMOS transistor, the third NMOS transistor, the fourth NMOS transistor, the third PMOS transistor, the fourth PMOS transistor, and the fifth PMOS transistor comprises a second threshold voltage higher than the first threshold voltage.

15. The power management circuit as claimed in claim 1, wherein the logic cell is a differential cascode voltage switch with pass-gate (DCVSPG) circuit.

16. The power management circuit as claimed in claim 1, wherein the logic cell is a differential cascode voltage switch (DCVS) circuit.

* * * * *